(12) United States Patent
Hirano et al.

(10) Patent No.: US 11,217,726 B2
(45) Date of Patent: Jan. 4, 2022

(54) NITRIDE SEMICONDUCTOR ULTRAVIOLET LIGHT-EMITTING ELEMENT

(71) Applicant: Soko Kagaku Co., Ltd., Ishikawa (JP)

(72) Inventors: Akira Hirano, Aichi (JP); Yosuke Nagasawa, Nara (JP); Shigefusa Chichibu, Miyagi (JP); Kazunobu Kojima, Miyagi (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 6 days.

(21) Appl. No.: 16/969,161

(22) PCT Filed: Feb. 14, 2018

(86) PCT No.: PCT/JP2018/005126
§ 371 (c)(1),
(2) Date: Aug. 11, 2020

(87) PCT Pub. No.: WO2019/159265
PCT Pub. Date: Aug. 22, 2019

(65) Prior Publication Data
US 2021/0043804 A1    Feb. 11, 2021

(51) Int. Cl.
*H01L 33/32* (2010.01)
*H01L 33/06* (2010.01)
*H01L 33/00* (2010.01)

(52) U.S. Cl.
CPC ............ *H01L 33/32* (2013.01); *H01L 33/007* (2013.01); *H01L 33/0075* (2013.01); *H01L 33/06* (2013.01)

(58) Field of Classification Search
CPC ..... H01L 33/32; H01L 33/0075; H01L 33/06; H01L 33/0062; H01L 33/007; H01L 33/36
See application file for complete search history.

(56) References Cited

U.S. PATENT DOCUMENTS

2014/0103289 A1   4/2014  Liao et al.
2014/0158983 A1*  6/2014  Pernot ................... H01L 33/06
                                                  257/13
(Continued)

FOREIGN PATENT DOCUMENTS

JP   2012089754 A   5/2012
JP   2017168640 A   9/2017
(Continued)

OTHER PUBLICATIONS

Nagamatsu et al., "High-efficiency AlGaN-based UV light-emitting diode on laterally overgrown AlN," Journal of Crystal Growth, vol. 310, Issues 7-9, Apr. 2008, pp. 2326-2329.
(Continued)

*Primary Examiner* — Savitri Mulpuri
(74) *Attorney, Agent, or Firm* — Haynes Beffel & Wolfeld LLP

(57) ABSTRACT

To improve a wall plug efficiency in a nitride semiconductor light-emitting element for extracting ultraviolet light emitted from an active layer toward an n-type nitride semiconductor layer side to outside of the element. In the n-type AlGaN-based semiconductor layer 21 constituting the nitride semiconductor light-emitting element 1, a plurality of thin film-like Ga-rich layers that is a part of the n-type layer 21 having a locally high Ga composition ratio exists spaced apart from each other in a vertical direction that is orthogonal to the upper surface of the n-type layer 21, an extending direction of at least a part of the plurality of Ga-rich layers on a first plane parallel to the vertical direction is inclined with respect to an intersection line between the upper surface of the n-type layer and the first plane, the plurality of Ga-rich layers exists in stripes on the second plane parallel to the upper surface of the n-type layer 21 in an upper layer region having a thickness of 100 nm or less at lower side from the upper surface of the n-type layer 21, AlN molar fractions of
(Continued)

the Ga-rich layers 21b are greater than AlN molar fraction of a well layer 22b in an active layer 22 constituting the light-emitting element 1.

11 Claims, 8 Drawing Sheets

(56) References Cited

U.S. PATENT DOCUMENTS

| | | | |
|---|---|---|---|
| 2014/0209857 A1* | 7/2014 | Takano | H01L 33/007 |
| | | | 257/13 |
| 2015/0243856 A1 | 8/2015 | Yamada et al. | |
| 2016/0027962 A1 | 1/2016 | Liao et al. | |
| 2017/0263817 A1 | 9/2017 | Hirano et al. | |
| 2018/0261725 A1* | 9/2018 | Kaneda | H01L 33/16 |
| 2019/0393378 A1* | 12/2019 | Wada | H01L 33/0075 |
| 2020/0161505 A1* | 5/2020 | Inazu | H01L 33/06 |
| 2020/0274040 A1* | 8/2020 | Hirano | G02B 3/00 |
| 2020/0321491 A1* | 10/2020 | Hirano | H01L 33/0095 |
| 2020/0357953 A1* | 11/2020 | Hirano | H01L 33/32 |
| 2020/0373463 A1* | 11/2020 | Hirano | H01L 21/20 |

FOREIGN PATENT DOCUMENTS

| | | |
|---|---|---|
| JP | 2017224841 A | 12/2017 |
| TW | 201308656 A | 2/2013 |
| WO | 2014178288 A1 | 11/2014 |
| WO | 2016157518 A1 | 10/2016 |
| WO | 2017013729 A1 | 1/2017 |

OTHER PUBLICATIONS

Sumiya et al., "AlGaN-Based Deep Ultraviolet Light-Emitting Diodes Grown on Epitaxial AlN/Sapphire Templates," Japanese J. Appl. Phys. vol. 47, No. 1, Jan. 18, 2008, pp. 43-46.

* cited by examiner

NITRIDE SEMICONDUCTOR ULTRAVIOLET LIGHT-EMITTING ELEMENT

TECHNICAL FIELD

The present invention relates to a nitride semiconductor ultraviolet light-emitting element having a light emitting layer made of an AlGaN-based semiconductor.

BACKGROUND ART

In general, there are a lot of nitride semiconductor light-emitting elements with a light-emitting element structure comprising a plurality of nitride semiconductor layers formed by epitaxial growth on a substrate such as sapphire. A nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light-emitting element structure of a light-emitting diode has a double hetero structure in which an active layer made of a nitride semiconductor layer having a single-quantum-well structure (SQW) or a multi-quantum-well structure (MQW) is sandwiched between an n-type nitride semiconductor layer and a p-type nitride semiconductor layer. When the active layer is an AlGaN-based semiconductor layer, by adjusting an AlN molar fraction (also referred to as an Al composition ratio), band gap energy can be adjusted within a range where band gap energies that can be taken by GaN and AlN (about 3.4 eV and about 6.2 eV) are lower and upper limits, so that an ultraviolet light-emitting element having a light emission wavelength of about 200 nm to about 365 nm is obtained. Specifically, by passing a forward current from the p-type nitride semiconductor layer toward the n-type nitride semiconductor layer, light emission corresponding to the band gap energy due to recombination of carriers (electrons and holes) occurs in the active layer. In order to supply the forward current from the outside, a p-electrode is provided on the p-type nitride semiconductor layer, and an n-electrode is provided on the n-type nitride semiconductor layer.

When the active layer is an AlGaN-based semiconductor layer, the n-type nitride semiconductor layer and the p-type nitride semiconductor layer sandwiching the active layer are composed of the AlGaN-based semiconductor layer having a higher AlN molar fraction than the active layer. However, since the p-type nitride semiconductor layer of a high AlN molar fraction is difficult to form a good ohmic contact with the p-electrode, it is generally performed to form a p-type contact layer made of a p-type AlGaN semiconductor with a low AlN molar fraction (specifically p-GaN), which can have a good ohmic contact with the p-electrode, to the uppermost layer of the p-type nitride semiconductor layer. Since the AlN molar fraction of the p-type contact layer is smaller than that of the AlGaN-based semiconductor constituting the active layer, ultraviolet light emitted toward the p-type nitride semiconductor layer side from the active layer is absorbed in the p-type contact layer, and cannot be effectively extracted to the outside of the element. Therefore, a typical ultraviolet light-emitting diode having an active layer made of an AlGaN-based semiconductor layer employs an element structure as schematically shown in FIG. 8. The ultraviolet light emitted toward the n-type nitride semiconductor layer side from the active layer is effectively extracted to the outside of the element (e.g., see Patent Documents 1 and 2, Non-Patent Documents 1 and 2, etc. listed below).

As shown in FIG. 8, the typical UV light-emitting diode is constructed by depositing an n-type AlGaN-based semiconductor layer 103, an active layer 104, a p-type AlGaN-based semiconductor layer 105, and a p-type contact layer 106 on a template 102 formed by depositing an AlGaN-based semiconductor layer 101 (e.g., AlN layer) on a substrate 100 such as a sapphire substrate, and etching away respective portions of the active layer 104, the p-type AlGaN-based semiconductor layer 105, and the p-type contact layer 106 until the n-type AlGaN-based semiconductor layer 103 is exposed, and forming an n-electrode 107 on the exposed surface of the n-type AlGaN-based semiconductor layer 103 and an p-electrode 108 on the surface of the p-type contact layer 106.

PRIOR ART DOCUMENTS

Patent Document

Patent Document 1: WO2014/178288
Patent Document 2: WO2016/157518

Non-Patent Document

NON-PATENT DOCUMENT 1: Kentaro Nagamatsu, et. al., "High-efficiency AlGaN-based UV light-emitting diode on laterally overgrown AlN", Journal of Crystal Growth, 2008, 310, pp. 2326-2329

NON-PATENT DOCUMENT 2: Shigeaki Sumiya, et al., "AlGaN-Based Deep Ultraviolet Light-Emitting Diodes Grown on Epitaxial AlN/Sapphire Templates", Japanese Journal of Applied Physics, Vol. 47, No. 1, 2008, pp. 43-46

SUMMARY OF THE INVENTION

Problems to be Solved by the Invention

A wall plug efficiency Ewp of the light-emitting element is a light emission efficiency defined as a ratio of the light output to the total power input to the light-emitting element, and is represented by a product (Eex×Ev) of an external quantum efficiency Eex of the light-emitting element and a voltage efficiency Ev represented by a ratio (Vg/V) of a voltage Vg applied to the active layer and a driving voltage V applied to the light-emitting element. On the other hand, the external quantum efficiency Eex of the light-emitting element is defined as a product (Ein×Eext) of an internal quantum efficiency Ein indicating a light emission efficiency due to carrier recombination in the active layer and a light extraction efficiency Eext indicating an efficiency of extracting the light emitted in the active layer to the outside of the light-emitting element.

Therefore, in order to improve the wall plug efficiency Ewp, each of the voltage efficiency Ev, the internal quantum efficiency Ein, and the light extraction efficiency Eext has to be improved individually, and a number of proposals have been made so far.

The internal quantum efficiency has been improved by improving the crystalline quality of AlGaN-based semiconductor layer and by increasing the injection efficiency of carriers into the active layer. For example, the latter attempt has been made to make the active layer a multi-quantum-well structure and to provide an electron blocking layer on the active layer, but there is still room for improvement.

Assuming that the carrier densities in the active layer are n, the recombination of carriers is approximated by a model composed of three types of recombination represented by the following Equation (1) as an empirical rule.

$$R = An + Bn^2 + Cn^3 \quad (1)$$

In Equation (1), R on the left side is the recombination rate of carriers (corresponding to the current injected into the active layer), and A, B, and C on the right side are the coefficients of Shockley Reed-Hole (SRH) recombination in which carriers recombine via non-radiative recombination centers, radiative recombination, and Auger recombination. For the light-emitting diode, usually, since the effect of Auger recombination proportional to the third power of the carrier density n is negligible, further, assuming that the current density of the current injected into the light-emitting element is low and that the ratio of the current overflowing not injected into the active layer is small and can be neglected, the internal quantum efficiency Ein is approximately expressed by the function f(n) of the carrier density n in the following Equation (2).

$$Ein = f(n) = Bn/(A + Bn) \quad (2)$$

According to Equation (2), the internal quantum efficiency Ein is increased by increasing the carrier density n within a range in which Auger recombination is negligible.

On the other hand, in the element structure shown in FIG. 8, there are various parasitic resistances on the current path of the forward current flowing from the p-electrode 108 to the n-electrode 107, and when the parasitic resistance increases, the voltage applied to active layer 104 relative to the forward bias applied between the p-electrode 108 and the n-electrode 107 becomes relatively small due to the voltage drop caused by the parasitic resistance, resulting in a decrease in the voltage efficiency Ev. As a result, the wall plug efficiency Ewp of the light-emitting element is decreased.

In particular, in the element structure shown in FIG. 8, since it is impossible to form the n-electrode 107 directly below the active layer 104, the active layer 104 and the n-electrode 107 are separated in the lateral direction (in the direction parallel to the surface of the n-type AlGaN semiconductor layer 103), and the lateral electric resistance of the n-type AlGaN semiconductor layer 103 becomes a large parasitic resistance. Further, in the ultraviolet light-emitting element, with shortening the emission wavelength, although the AlN molar fractions of AlGaN-based semiconductors constituting the active layer 104 and the n-type AlGaN-based semiconductor layer 103 are increased, the specific resistance of the n-type AlGaN-based semiconductor tends to be higher as the AlN molar fraction is larger, the decrease in the voltage efficiency Ev due to the parasitic resistance of the n-type AlGaN-based semiconductor layer 103 becomes significant with shortening the emission wavelength.

Therefore, in the ultraviolet light-emitting diode in which the active layer is the AlGaN-based semiconductor layer, the planarly-viewed shape of the active layer has been set to a comb-like shape capable of shortening the distance of the current path from any point in the active layer to the n-electrode so that decreases in the voltage efficiency Ev caused by the parasitic resistance of the n-type AlGaN-based semiconductor layer and in the wall-plug efficiency Ewp are suppressed (e.g., see Patent Documents 1 and 2 below, etc.).

Incidentally, in a typical nitride semiconductor ultraviolet light-emitting element, the film thickness of the n-type AlGaN-based semiconductor layer is about 1 to 2 μm (for example, see Patent Document 2 and Non-Patent Documents 1 and 2 above), whereas the chip size is 400 μm to 1 mm or more, and therefore the smallest width of the planarly-viewed shape of the active layer is considered to be at least 40 μm assuming a comb-like shape as disclosed in Patent Documents 1 and 2 above. In this case, while the length of the current path in the vertical direction (up and down direction) in the n-type AlGaN-based semiconductor layer is 1 to 2 μm or less, the length of the current path in the n-type AlGaN-based semiconductor layer in the lateral direction is 20 μm or more (10 times or more). Even if the specific resistance of the n-type AlGaN-based semiconductor layer is uniform in the layer, the electrical resistance in the lateral direction of the current path (resistivity×length/cross-sectional area) is 100 times or more of the electrical resistance in the vertical direction of the current path. Therefore, the effect of the parasitic resistance of the n-type AlGaN-based semiconductor layer becomes predominant in the lateral direction.

The present invention has been made in view of the above issues, and its object is to improve the wall plug efficiency in a nitride semiconductor light-emitting element that extract ultraviolet light emitted from the active layer toward the n-type nitride semiconductor layer side to the outside of the element.

Means for Solving the Problem

In order to achieve the above object, the present invention provide a nitride semiconductor ultraviolet light-emitting element comprising:

a semiconductor laminated portion including an n-type layer composed of an n-type AlGaN-based semiconductor layer, an active layer of an AlGaN-based semiconductor layer formed on a first region on an upper surface of the n-type layer, and a p-type layer composed of at least one p-type AlGaN-based semiconductor layer formed on an upper surface of the active layer;

an n-electrode formed on a second region that is not the first region on the upper surface of the n-type layer; and a p-electrode formed on an upper surface of the p-type layer, wherein the active layer has a quantum well structure comprising at least one well layer composed of an AlGaN-based semiconductor layer, in the n-type layer below at least the first region of the upper surface of the n-type layer, a plurality of thin film-like Ga-rich layers that is a part of the n-type layer having a locally high Ga composition ratio exists spaced apart from each other in a vertical direction that is orthogonal to the upper surface, an extending direction of at least a part of the plurality of Ga-rich layers on a first plane parallel to the vertical direction is inclined with respect to an intersection line between the upper surface of the n-type layer and the first plane, in each of a plurality of second planes parallel to the upper surface of the n-type layer, the plurality of Ga-rich layers is present in stripes, and at least one of the plurality of second planes exists in an upper layer region having a thickness of 100 nm or less at lower side from the upper surface of the n-type layer, AlN molar fractions of the Ga-rich layers present below the first region are larger than an AlN molar fraction of the well layer.

The AlGaN-based semiconductor is represented by the general formula $Al_{1-X}Ga_XN$ (0≤x≤1), but the semiconductor may contain a trace amount of an impurity such as a Group 3 element such as B or In or a Group 5 element such as P, as long as the band gap energy is within a range of the lower limit and the upper limit of the band gap energy that GaN and AlN can obtain, respectively. Furthermore, the n-type or p-type AlGaN-based semiconductor layer is a layer in which Si or Mg or the like is doped as a donor impurity or an acceptor impurity in the AlGaN-based semiconductor layer. In the present application, the AlGaN-based semiconductor layer, not specified as p-type and n-type, means undoped AlGaN-based semiconductor layer, but even in the case of the undoped layer, a trace amount of donor or acceptor impurities inevitably mixed may be included. Further, the first plane and the second plane are not necessarily an exposed surface and a boundary surface between the semiconductor layers which are specifically formed in the semiconductor laminated portion by the manufacturing process, but are a virtual plane extending in parallel to the vertical direction in the n-type layer, and a virtual plane extending in perpendicular to the vertical direction.

According to the nitride semiconductor ultraviolet light-emitting element of the above-mentioned features, the improvement of the internal quantum-efficiency is expected for the following reasons. In the second plane in the upper layer region, a plurality of Ga-rich layers is present in stripes, and thus, in the n-type layer immediately below the active layer, composition modulation of Ga occurs in which Ga-rich layer having a high Ga composition ratio and Ga layer having a relatively low Ga composition ratio (referred to as base layer) are alternately present. Since the Ga-rich layer is easier to conduct current than the base layer, the carrier density injected from the Ga-rich layer to the active layer is higher than the carrier density injected from the base layer to the active layer, and the difference between the higher and lower carrier densities occurs in the plane parallel to the second plane in the active layer.

Assuming two minute regions S1 and S2 having the same area in a plane parallel to the second plane in the active layer, case 1 in which the composition modulation of Ga does not occur, and the current I injected into the minute regions S1 and S2 is the same I0, and case 2 in which the composition modulation of Ga occurs, and the current I1 injected into the minute region S1 becomes larger than the current I2 injected into the minute region S2 resulting in I1+I2=2×I0 (I1>I0, I2<I0) are considered In the case 1, the carrier density n is the same between the minute regions S1 and S2, and set to the carrier density n0. Accordingly, the respective internal quantum efficiencies Ein of the minute regions S1 and S2 are represented by f(n0), and the current Ig0 to be subjected to radiative recombination in the minute regions S1 and S2 and the total current Ig0t thereof are represented by the following Equation (3).

$$Ig0t=2Ig0=2f(n0)I0 \quad (3)$$

In the case 2, assuming I1=I0 (1+x), I2=I0 (1−x), where 0<x≤1, in the minute region S1, as with current I1, the carrier density n to be injected is increased by (1+x) times, the internal quantum efficiency Ein becomes an internal quantum efficiency f(n0(1+x)) which is higher than the internal quantum efficiency f(n0) of the minute region S1 of the case 1, and in the minute region S2, as with current I2, the injected carrier density n is decreased by (1−x) times, the internal quantum efficiency Ein becomes an internal quantum efficiency f(n0(1−x)) which is lower than the internal quantum efficiency f(n0) of the minute region S2 of the case 1. Therefore, the current Ig1, Ig2 to be used for radiative recombination in each of the minute regions S1 and S2 and the total current Ig1t thereof are expressed by the following Equation (4).

$$Ig1t=Ig1+Ig2=f(n0(1+x))I0(1+x)+f(n0(1-x))I0(1-x) \quad (4)$$

Here, the function f(n) is a function that monotonously increases from 0 to 1 by increasing the variable n from 0, and when the amounts of change of I1 and I2 from I0 are small, f(n0 (1+x)) and f(n0 (1−x)) can be approximated to f(n0)+Δ(x) and f(n0)−Δ(x), and the equation (4) becomes the following Equation (5).

$$Ig1t=2f(n0)I0+2\Delta(x)I0x=Ig0t+2\Delta(x)I0x \quad (5)$$

From the above Equation (5), it can be seen that when the amount of change of I1 and I2 from I0 is small, the current to be subjected to radiative recombination increases by Δ(x)I0x per minute region in the case 2 in which the composition modulation of Ga occurs, compared to the case 1 in which the composition modulation does not occur.

On the other hand, when the amount of change of I1 and I2 from I0 is large and x=1, the above equation (4) becomes the following Equation (6).

$$Ig1t=2f(2n0)I0 \quad (6)$$

Since f(2n0) in Equation (6) is larger than f(n0) in Equation (3), it can be seen that even when the amounts of change of I1 and I2 from I0 are large, the current subjected to radiative recombination increases by (f(2n0)-f(n0)) per minute area in the case 2 in which the composition modulation of Ga occurs, compared to the case 1 in which the composition modulation does not occur.

Thus, when the total current injected into the entire active layer is the same, the current subjected to radiative recombination in the entire active layer will be increased more in the case 2 in which the composition modulation of Ga occurs than in the case 1 in which the composition modulation does not occur, and the internal quantum-efficiency Ein of the entire active layer will be increased. As a result, an improvement in the wall plug efficiency is expected.

It should be noted that, even if the composition modulation of Ga does not occur in the active layer, when the composition modulation of Ga occurs in the n-type layer existing in the vicinity of the active layer, a change in the carrier density injected toward the active layer occurs, and as a result, the internal quantum efficiency Ein is expected to be improved.

According to the nitride semiconductor ultraviolet light-emitting element of the above feature, since the plurality of Ga-rich layers in which specific resistance is relatively low in the n-type layer, i.e., current easily flows is formed vertically spaced apart from each other in the n-type layer below the first region where the active layer is present thereon, the forward current flowing from the p-type nitride semiconductor layer toward the n-type nitride semiconductor layer due to the forward bias applied between the p-electrode and the n-electrode can pass through the Ga-rich layers, in which the current easily flows, when flowing in the lateral direction (the direction parallel to the upper surface of the n-type layer) in the n-type layer directly below the active layer toward the region directly below the n-type electrode. Therefore, it is considered that the parasitic resistance in the lateral direction in the n-type layer can be reduced as compared with the case where the plurality of Ga-rich layers is not formed. Consequently, in the element structure for extracting ultraviolet light emitted from the active layer toward the n-type nitride semiconductor layer side to the outside of the element, the voltage drop caused by the parasitic resistance can be suppressed, and the improvement of the wall plug efficiency by improving the voltage efficiency Ev is expected.

Since the voltage drop caused by the parasitic resistance becomes significant from the outer peripheral portion of the first region toward the center, the minimum width of the first region is limited to a certain value or less due to the voltage drop. However, if the voltage drop can be suppressed, the minimum width of first region can be increased. As a result, the area of first region in the chip size can be increased.

Further, in the nitride semiconductor ultraviolet light-emitting element of the above-described feature, it is preferable that minute areas of 1 µm square or less in which composition modulation of Ga occurs due to partial presence of the Ga-rich layers in stripes is dispersed on at least one of the second planes in the upper layer region below the first region. Thus, the high and low portions of the current density of the current injected into the active layer can be divided and uniformly dispersed, it is possible to prevent the localization of heat generation due to non-radiative recombination, changes in the emission intensity due to the change in the internal quantum efficiency caused by the composition modulation of Ga occurs in the minute areas, and the change in the emission intensity is uniformly distributed in the active layer. Therefore, it is possible to equalize the in-plane variation of the local emission intensity in the entire active layer, and macroscopic (coarse grain size) uniformity of the emission intensity in the active layer can be achieved.

Further, in the nitride semiconductor ultraviolet light-emitting element of the above-described feature, it is preferable that the plurality of Ga-rich layers has at least portions separated in the vertical direction in the upper layer region, and that a minimum value of vertical separation distance between the vertically adjacent Ga-rich layers is 100 nm or less.

Further, in the nitride semiconductor ultraviolet light-emitting element of the above-described feature, it is preferable that at least a part of the plurality of Ga-rich layers exists in the n-type layer below an area where the n-electrode is formed in the second region of the upper surface of the n-type layer.

Furthermore, in the nitride semiconductor ultraviolet light-emitting element of the above-described features, it is preferable that at least a part of the plurality of Ga-rich layers has a low inclined portion in which an inclination angle of the extending direction of the Ga-rich layers on the first plane is 0° or more and 10° or less with respect to the intersection line. Further, it is more preferable that the low inclined portion exists in the upper layer region.

Furthermore, in the nitride semiconductor ultraviolet light-emitting element of the above-described features, it is preferable that the plurality of Ga-rich layers has at least portions intersecting with or diverging from another Ga-rich layer on the first plane.

Further, in the nitride semiconductor ultraviolet light-emitting element of the above-described feature, it is preferable that an inclination angle of the extending direction with respect to the intersection line at any one point of the plurality of Ga-rich layers on the first plane is within a range of 0° or more and less than 45°.

In each of the preferred embodiments of the nitride semiconductor ultraviolet light-emitting element of the above-described features, the reduction of the parasitic resistance is further promoted, the voltage drop caused by the parasitic resistance can be further suppressed, and further improvement in the voltage efficiency Ev can be achieved, so that further improvement in the wall plug efficiency can be expected.

Further, in the nitride semiconductor ultraviolet light-emitting element of the above-described feature, it is preferable that a low impurity concentration layer having a relatively lower n-type impurity concentration than other regions in the n-type layer exists in the n-type layer in a layer shape parallel to the second plane. Further, it is more preferable that the low impurity concentration layer is present in the upper layer region.

In the nitride semiconductor ultraviolet light-emitting element of the above-described feature, the extending direction of at least a part of the plurality of Ga-rich layers is inclined with respect to the intersection line between the upper surface of the n-type layer and the first plane. This means that the Ga-rich layers are grown simultaneously with respect to both the lateral direction and the vertical direction, and as the n-type impurity concentration is lower, the lateral growth is promoted, and as a result, the reduction of the lateral parasitic resistance of the n-type layer is promoted.

Furthermore, it is preferable that the nitride semiconductor ultraviolet light-emitting element of the above-described features further comprises an underlying part including a sapphire substrate, the semiconductor laminated portion is formed on the underlying part, and a plurality of step portions to be growth start points of the Ga-rich layers is dispersedly formed on an upper surface of the underlying part.

Effect of the Invention

According to the nitride semiconductor ultraviolet light-emitting element of the above-described features, as a plurality of Ga-rich layers is formed in the n-type layer, an improvement in the wall plug efficiency due to an improvement in the internal quantum efficiency Ein or the voltage efficiency Ev or both is expected.

DESCRIPTION OF EMBODIMENT

Figure 1:
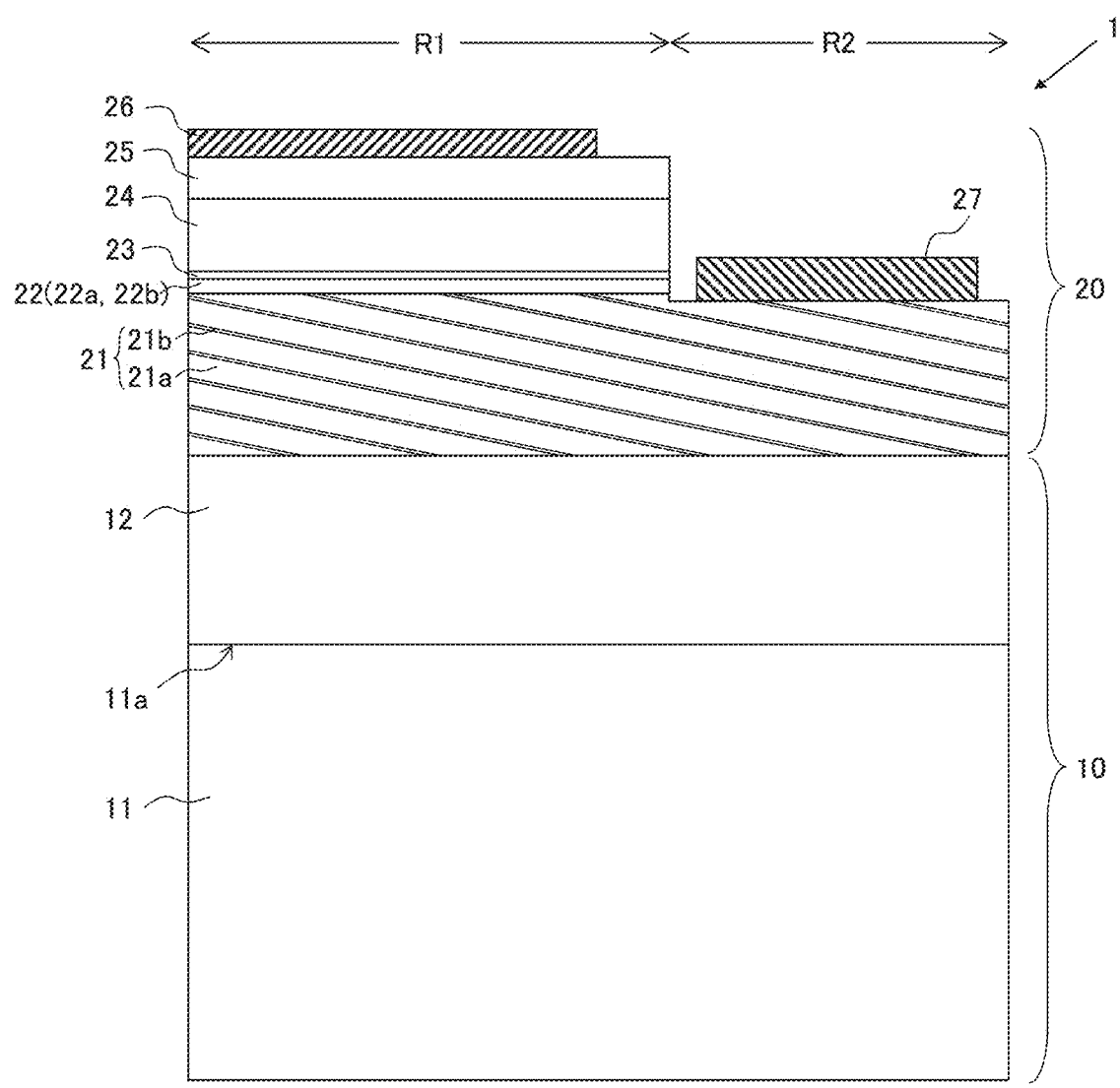
FIG. 1 is a fragmentary cross-sectional view schematically showing an example of a structure of the nitride semiconductor ultraviolet light-emitting element according to an embodiment of the present invention.

A nitride semiconductor ultraviolet light-emitting element (hereinafter, simply referred to as a "light-emitting element") according to an embodiment of the present invention will be described with reference to the drawings. Incidentally, in the drawings used in the following description (except for HAADF-STEM images), the dimensional ratios of each part are not necessarily the same as those of the actual elements because the essential part is emphasized to schematically show the invention for ease of understanding of the description. Hereinafter, in the present embodiment, description will be made on the assumption that the light-emitting element is a light-emitting diode.

<Element Structure of the Light-Emitting Element>

As shown in FIG. 1, the light-emitting element 1 of the present embodiment includes an underlying part 10 including a sapphire substrate 11, and a light-emitting element structure part 20 including a plurality of AlGaN-based semiconductor layers 21-25, a p-electrode 26, and an n-electrode 27. The nitride semiconductor light-emitting element 1 is mounted (flip-chip mounted) on a mounting base (submount or the like) with facing a side of the light-emitting element structure portion 20 (an upper side in FIG. 1) toward the mounting base, and light is extracted from a side of the underlying part 10 (a lower side in FIG. 1). In this specification, for convenience of explanation, a direction perpendicular to the main surface 11a of the sapphire substrate 11 (or the upper surface of the underlying part 10 and the respective AlGaN-based semiconductor layers 21 to 25) is referred to as "up and down direction" (or "vertical direction"), and a direction from the underlying part 10 to the light-emitting element structure part 20 is set to an upward direction and an opposite direction thereof is defined as a downward direction. Further, a plane parallel to the vertical direction is referred to as a "first plane". Furthermore, a plane parallel to the main surface 11a of sapphire substrate 11 (or the upper surface of the underlying part 10 and the respective AlGaN-based semiconductor layers 21 to 25) is referred to as a "second plane," and a direction parallel to the second plane is referred to as a "lateral direction."

The underlying part 10 is configured with a sapphire substrate 11 and an AlN layer 12 formed directly on the main surface 11a of the sapphire substrate 11. The AlN layer 12 is composed of AlN crystals epitaxially grown from the main surface of the sapphire substrate 11, the AlN crystals have an epitaxial crystal orientation relationship with respect to the main surface 11a of the sapphire substrate 11. Specifically, for example, the AlN crystal is grown so that the C-axis direction of the sapphire substrate 11 (<0001> direction) and the C-axis direction of the AlN crystal is aligned. The AlN crystals constituting AlN layer 12 may contain a trace amount of Ga or another impurity. Further, a layer composed of an $Al_\alpha Ga_{1-\alpha}N$ ($1>\alpha>0$) based semiconductor may be further formed on the upper surface of AlN layer 12. In the present embodiment, the film thickness of the AlN layer 12 is assumed to be about 2 μm to 3 μm. The structure of the underlying part 10 and a substrate to be used are not limited to those described above. For example, an AlGaN layer having an AlN molar fraction greater than or equal to the AlN molar fraction of the AlGaN semiconductor layer 21 may be provided between the AlN layer 12 and the AlGaN semiconductor layer 21.

The light-emitting element structure part 20 comprises a structure (semiconductor laminated portion) having an n-type cladding layer 21 (n-type layer), an active layer 22, an electron blocking layer 23 (a p-type layer), a p-type cladding layer 24 (a p-type layer), and p-type contact layer 25 (a p-type layer) stacked in order from the underlying part 10 side by epitaxially growing them in order.

As shown in FIG. 1, in the light-emitting element structure part 20, the active layer 22, the electron blocking layer 23, the p-type cladding layer 24, and the p-type contact layer 25 are formed on the first region R1 of the upper surface of the n-type cladding layer 21 as a result of removing portions of them stacked on the second region R2 of the upper surface of the n-type cladding layer 21 by etching or the like. The upper surface of the n-type cladding layer 21 is exposed in the second region R2 except for first region R1. The upper surface of the n-type cladding layer 21 may differ in height between the first region R1 and the second region R2, as schematically shown in FIG. 1, where the upper surface of the n-type cladding layer 21 is individually defined in the first region R1 and the second region R2.

The n-type cladding layer 21 includes a Ga-rich layer 21b composed of an n-type $Al_W Ga_{1-W}N$ ($X>W>Q$) based semiconductor having a locally high Ga composition ratio in a base layer 21a composed of an n-type $Al_X Ga_{1-X}N$ ($1 \geq X>Q$) based semiconductor. ($1-X$) and ($1-W$) are Ga-composition ratios. Q is the AlN molar fraction (Al composition ratio) of an $Al_Q Ga_{1-Q}N$ ($W>Q\geq 0$) based semiconductor constituting a well layer 22b of the active layer 22, which will be described later. In the present embodiment, the film thickness of the n-type cladding layer 21 is assumed to be about 1 μm to 2 μm in the same manner as the film thickness employed in the typical nitride semiconductor ultraviolet light-emitting element, but the film thickness may be about 2 μm to 4 μm. The AlN molar fraction X of the n-type $Al_X Ga_{1-X}N$ constituting the base layer 21a and the AlN molar fraction W of the n-type $Al_W Ga_{1-W}N$ constituting the Ga-rich layer 21b are not necessarily constant in the n-type cladding layer 21, and it is sufficient that the relationship of $X>W>Q$ is satisfied between the base layer 21a and the Ga-rich layer 21b existing in the local area of the n-type cladding layer 21.

The active layer 22 has a single or multiple quantum well structure in which one or more layers of a well layer 22b composed of an $Al_Q Ga_{1-Q}N$ ($W>Q\geq 0$) based semiconductor and a barrier layer 22a composed of an $Al_P Ga_{1-P}N$ ($X \geq P>Q$) based semiconductor are alternately stacked. The barrier layer 22a may be provided between the uppermost well layer 22b and the electron blocking layer 23, or an AlGaN layer or an AlN layer having thinner film thickness and a higher AlN molar fraction than the barrier layer 22a may be provided between the uppermost well layer 22b and electron blocking layer 23.

The electron blocking layer 23 is composed of a p-type $Al_Y Ga_{1-Y}N$ ($1 \geq Y>P$) based semiconductor. The p-type cladding layer 24 is composed of a p-type $Al_Z Ga_{1-Z}N$ ($Y>Z>R$) based semiconductor. The p-type contact layer 25 is composed of a p-type $Al_R Ga_{1-R}N$ ($Z>R\geq 0$) based semiconductor. The p-type contact layer 25 is typically composed of GaN, i.e., R=0. The thicknesses of the respective layers such as the active layer 22, the electron blocking layer 23, the p-type cladding layer 24, and the p-type contact layer 25 are appropriately determined in accordance with the emission wavelength characteristics and the electric characteristics of the light-emitting element 1. The p-type cladding layer 24 may be omitted in order to reduce the parasitic resistance of the p-type layers.

Figure 2:
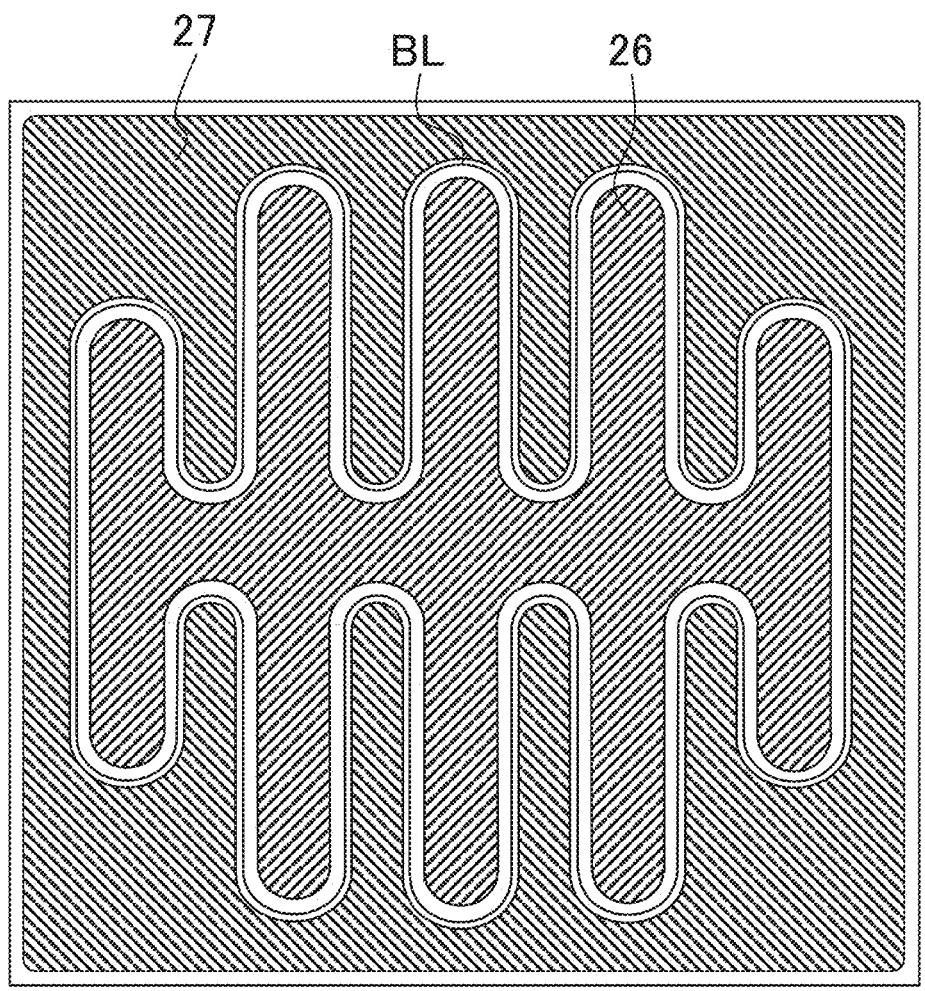
FIG. 2 is a plan view schematically showing an example of a structure when viewed the nitride semiconductor ultraviolet light-emitting element shown in FIG. 1 from the upper side of FIG. 1.

The p-electrode 26 is made of, for example, a multilayer metal film such as Ni/Au, and is formed on the upper surface of the p-type contact layer 25. The n-electrode 27 is made of, for example, a multilayer metal film such as Ti/Al/Ti/Au and is formed on a part of the exposed surface of the n-type cladding layer 21 in second region R2. The p-electrode 26 and the n-electrode 27 are not limited to the multilayer metal film described above, and the electrode structure such as the metal constituting each electrode, the number of layers, and the stacking order of layers may be changed as appropriate. FIG. 2 shows an example of shapes of the p-electrode 26 and the n-electrode 27 viewed from the upper side of the light-emitting elements 1. In FIG. 2, a line BL existing between the p-electrode 26 and the n-electrode 27 represents a border line between the first region R1 and the second region R2, and coincides with the outer peripheral side wall surfaces of the active layer 22, the electron blocking layer 23, the p-type cladding layer 24, and the p-type contact layer 25.

Figure 3:
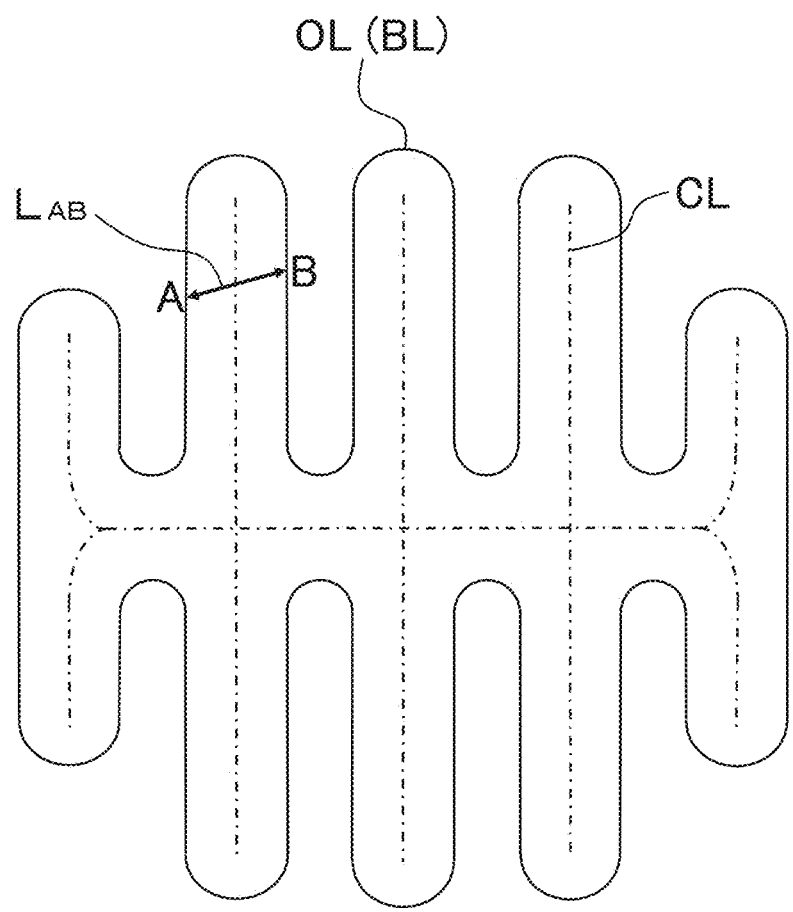
FIG. 3 is a diagram for explaining the definition of the minimum width of the planarly-viewed shape.

In the present embodiment, as shown in FIG. 2, a comb-like shape is employed as an example of the planarly-viewed shapes of the first region R1 and the p-electrode 26. In this embodiment, as an example, the minimum width of the planarly-viewed shape of the first region R1 is assumed to be 40 μm or more, and is preferably 40 μm or more and 130 μm or less, and more preferably 60 μm or more and 100 μm or less. Here, the minimum width of the planarly-viewed shape is a minimum value of the length of any line segment $L_{AB}$ connecting the two points A and B on the outer peripheral line OL of the planarly-viewed shape (corresponding to the boundary line BL in FIG. 2) across a skeleton line CL, where the skeleton line CL is a finally remained line when the outer peripheral line OL is reduced gradually and evenly toward the inner side in a direction perpendicular to the outer peripheral line OL, and contacted from both sides, as shown in FIG. 3.

When a forward bias is applied between p-electrode 26 and n-electrode 27, holes are supplied from p-electrode 26 toward active layer 22, electrons are supplied from n-electrode 27 toward active layer 22, and the supplied holes and electrons respectively reach active layer 22 and recombine to emit light. This also causes a forward current to flow between p-electrode 26 and n-electrode 27.

As to the Ga-rich layer 21b, as shown schematically by a double line in FIG. 1, a plurality of layers is vertically separated from each other. Further, in one first plane (for example, the cross section shown in FIG. 1) which is parallel to the vertical direction, at least a part of the Ga-rich layers 21b is inclined with respect to the lateral direction (the extending direction of an intersection line of the first plane and the second plane). In the first plane shown in FIG. 1, each layer of the Ga-rich layers 21b is schematically illustrated by a parallel line (double line), but as will be described later, the inclination angle θ formed between the extending direction and the lateral direction is not necessarily the same between the Ga-rich layers 21b, and may vary depending on the position even within the same Ga-rich layer 21b, so that the Ga-rich layers 21b on the first plane do not necessarily extend linearly. Further, the inclination angle θ is also changed by the orientation of the first plane. Therefore, a part of the Ga-rich layers 21b may intersect with or diverge from another Ga-rich layer 21b on the first plane. In addition, a minimum value of the separation distances in the vertical direction between the Ga-rich layers 21b adjoining in the vertical direction is 100 nm or less. That is, the minimum value of the separation distances include substantially 0 nm and assume the intersect and divergence between the Ga-rich layers 21b described above.

As described above, the Ga-rich layer 21b is a place where the Ga composition ratio is locally high in the base layer 21a, and it is sufficient that the relationship of X>W is satisfied between the respective AlN molar fractions of the base layer 21a and the Ga-rich layer 21b present within a local area of the n-type cladding layer 21. Therefore, when the AlN molar fractions of both layers are asymptotically consecutive in the vicinity of the boundary between the base layer 21a and the Ga-rich layer 21b, the boundary between both layers cannot be clearly defined. Therefore, in such cases, a portion in which the AlN molar fraction is lower than the reference value can be relatively defined as the Ga-rich layer 21b, assuming that the reference value is the mean AlN molar fraction of the entire n-type cladding layer 21, for example, the AlN molar fraction serving as a basis for the growth condition of the n-type cladding layer 21 (supply amount and flow rate of the source gas and the carrier gas used in the organometallic compound vapor phase epitaxy method), which will be described later. Further, in addition to the above-mentioned defining methods, for example, based on a HAADF-STEM image to be described later, a portion having a large brightness change may be defined as the boundary between both layers. However, in the present invention, the definition of the boundary between both layers is not significant, and it is sufficient if the presence of the Ga-rich layer 21b itself can be grasped.

In addition, the Ga-rich layer 21b is represented by a line (double line) on the first surface in FIG. 1, but also extends in parallel or inclined to the second plane in a direction perpendicular to the first plane, and has a two-dimensional expansion. Therefore, the plurality of Ga-rich layers 21b exists in stripes on the plurality of second planes in the n-type cladding layer 21. In the present embodiment, it is preferable that the second plane in which the plurality of Ga-rich layers 21b is present in strips is present in the upper layer region having a depth of 100 nm or less on the lower side from the upper surface of the n-type cladding layer 21. Further, it is more preferable that in a minute area of 1 μm square or less on at least one second plane in the upper layer region under the first region, the presence of the striped Ga-rich layer 21b partially causes composition modulation of Ga, and a plurality of the minute areas of him square or less is present dispersed on the second plane. Furthermore, a part of the Ga-rich layers 21b may intersect with or diverge from another Ga-rich layer 21b even on the second plane or may be looped.

The inclination angle θ of the Ga-rich layer 21b is preferably in the range of 0° and more and less than 45° on any first plane. Further, it is preferable that the plurality of Ga-rich layers 21b includes a low inclined portion having the inclination angle θ of 0° or more and 10° or less. Further, it is preferable that the low inclined portion is present in the upper layer region.

As shown in FIG. 1, it is preferable that the Ga-rich layers 21b are formed not only in the first region R1 but also in the second region R2, specifically below the n-electrode 27. In this case, any one of the Ga-rich layers 21b formed below the first region R1 is continuous with any one of the Ga-rich layers 21b formed below the second region R2.

<Method for Manufacturing Light Emitting Device>

Next, an example of a manufacturing method of the light-emitting element 1 illustrated in FIG. 1 will be described.

First, by a well-known epitaxial growth method such as metalorganic compound vapor epitaxy (MOVPE) method, the AlN layer 12 contained in underlying part 10 and the nitride semiconductor layers 21 to 25 contained in the light-emitting element structure part 20 are epitaxially grown on sapphire substrate 11 sequentially and laminated. At this time, Si, for example, as a donor impurity is doped into the n-type cladding layer 21, and Mg, for example, as an acceptor impurity is doped into the electron blocking layer 23, the p-type cladding layer 24, and the p-type contact layer 25.

In the present embodiment, in order to form a plurality of the Ga-rich layers 21b separated in the vertical direction in the n-type cladding layer 21, structural portions such as striped grooves 13a, protrusions 13b, or steps 13c, 13d where Ga is easily integrated by migration (hereinafter collectively referred to as "step portions 13") are formed on the upper surface of the AlN layer 12, as schematically shown in FIGS. 4A to 4D, so that growth start points of the striped Ga-rich layers 21b are formed immediately after the growth start of the n-type cladding layer 21 from the upper surface of the AlN layer 12. Here, the height (depth) of the step portions 13 is preferably about 3 nm to 100 nm. The interval in the lateral direction of the striped step portions 13 is preferably about 50 nm to 500 nm, more preferably about 100 nm to 300 nm. Incidentally, the longitudinal cross-sectional shape of the groove 13a and the protrusion 13b, shown in FIGS. 4A and 4B, can take various shapes such as rectangular, trapezoidal, V-shaped (inverted V-shaped), U-shaped (inverted U-shaped), etc. Furthermore, the step portions 13 are not limited to striped grooves 13a, protrusions 13b, or steps 13c, 13d, may be holes or protrusions scattered in an island-like on the upper surface of the AlN layer 12. The height (depth), lateral interval, and longitudinal cross-sectional shapes of the island-like step portions 13 are the same as when the step portions 13 are in stripes. Also, the planarly-viewed shape of the island-like step portions 13 may take a variety of shapes, such as circular, rectangular, triangular, hexagonal, and the like.

Figure 4A:
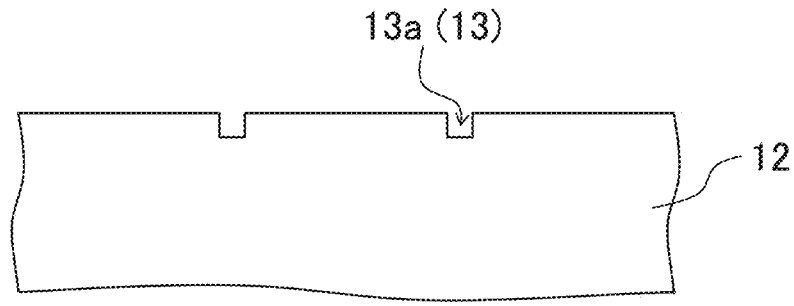
FIGS. 4A to 4D are fragmentary cross-sectional views schematically showing examples of the cross-sectional shapes of the step portion (groove, protrusion, step) formed on the surface of the AlN layer.
Figure 4B:
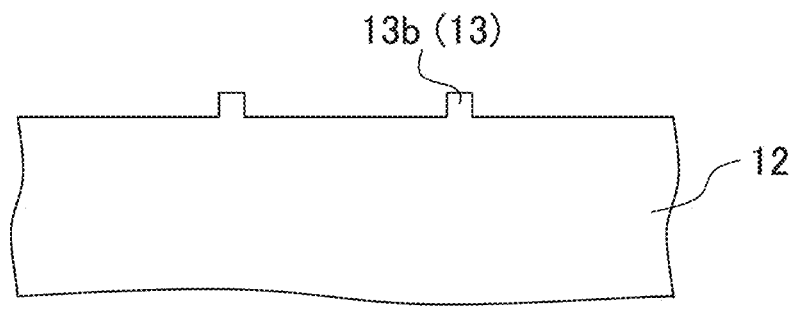
Figure 4C:
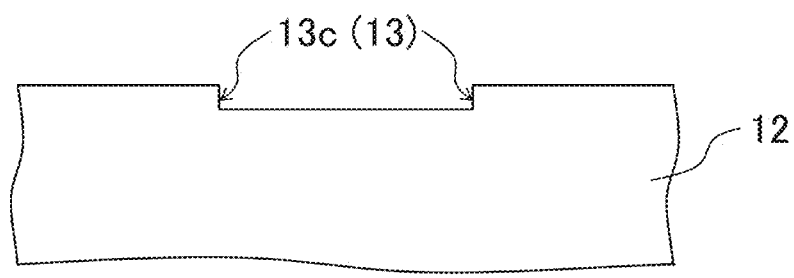

Step portions 13 (13a-13c) shown in FIGS. 4A to 4C can be formed by forming masks such as $SiO_2$, on a flat surface of the AlN layer 12 by, for example, nanoimprinting, interference fringe exposure, electron-beam exposure, patterning with steppers, or the like, and etching the surface of the AlN layer 12 by known etching methods such as reactive ion etching. Further, the steps 13d shown in FIG. 4D can be obtained by performing epitaxial growth so that the multi-step terraces T derived from the main surface 11a of the sapphire substrate 11 appears on the surface of AlN layer 12 (so that the surface of the terraces does not become flat without completely filled). As a condition of such epitaxial growth, for example, use of the sapphire substrate 11 in which the main surface 11a thereof is inclined at an angle (off angle) within a certain range (e.g., from 0 degree to several degrees) with respect to the (0001) plane and multi-step terraces appear on the main surface 11a, and growth rate in which the terraces easily appear (specifically, for example, the growth rate achieved by appropriately setting various conditions such as growth temperature, supply amount and flow rate of the source gas and the carrier gas) and the like are included. Note that these various conditions may differ depending on the type and structure of the film forming apparatus, and therefore, it is good to actually make some samples in the film forming apparatus and these conditions are specified. Further, as the island-like step portions 13, pits (holes) or hillocks (protrusion) of a hexagonal prism shape, a hexagonal pyramid shape, a hexagonal frustum shape, or the like, which appear on the surface during crystal growth of the AlN layer 12, can be used as long as they are formed so as to be dispersed on the upper surface of the AlN layer 12 at appropriate heights (depths) and lateral intervals. Incidentally, when the underlying part 10 is provided with a AlGaN layer on the AlN layer 12 and the upper surface of the underlying part 10 is the upper surface of the AlGaN layer, the striped or island-like step portions 13 described above are formed on the upper surface of the AlGaN layer.

As growth conditions of the n-type cladding layer 21, a growth temperature, a growth pressure, and a donor impurity concentration are selected so that the growth start points of the Ga-rich layers 21b are formed on the step portions formed on the upper surface of the AlN layer 12 by the migration of Ga immediately after the growth start, and the Ga-rich layer 21b can grow obliquely upward by the segregation due to the migration of Ga in accordance with the epitaxial growth of the n-type cladding layer 21 (the base layer 21a). Specifically, the growth temperature is preferably 1050° C. or higher at which the migration of Ga easily occurs, and the growth temperature is preferably 1150° C. or lower at which a good n-type AlGaN can be prepared. The growth pressure of 75 Torr or less is preferable as the growth condition of a good AlGaN, and the growth pressure of 10 Torr or more is practical as the control limit of the film forming apparatus. The donor impurity density is preferably about $1\times10^{18}$ to $5\times10^{18}$ cm$^{-3}$. The above-described growth temperature, growth pressure, and the like are examples, and the optimum conditions may be appropriately specified according to the film forming apparatus to be used. However, since the above suitable growth temperature condition is not compatible with the molecular beam epitaxy (MBE) method, an organometallic compound vapor epitaxy (MOVPE) method is preferred as a film forming method of the n-type cladding layer 21 Note that the supply amount and the flow rate of the source gases (trimethylaluminum (TMA) gas, trimethylgallium (TMG) gas, and ammonia gas) used in the organometallic compound vapor epitaxy method and the carrier gas are set according to the average AlN molar fraction Xa of the entire n-type AlGaN layer constituting the n-type cladding layer 21 The average AlN molar fraction Xa satisfies X>Xa>W for the AlN molar fraction X of the n-type $Al_xGa_{1-x}N$ constituting the base layer 21a and the AlN molar fraction W of the n-type $Al_WGa_{1-W}N$ constituting the Ga-rich layer 21b.

Note that the donor impurity concentration does not necessarily have to be uniformly controlled in the vertical direction with respect to the film thickness of the n-type cladding layer 21 For example, the low impurity concentration layer may be a layer in which the impurity concentration of a predetermined thin film thickness portion in the n-type cladding layer 21 is lower than the above-mentioned set concentration, and is controlled to be, for example, less than $1\times10^{18}$ cm$^{-3}$, more preferably, $1\times10^{17}$ cm$^{-3}$ or less. As the film thickness of the low impurity concentration layer, it is preferably about larger than 0 nm and 200 nm or less, more preferably about 10 nm or more and 100 nm or less, and still more preferably about 20 nm or more and 50 nm or less. Further, the donor impurity concentration of the low impurity concentration layer may be lower than the set concentration, and undoped layer (0 cm$^{-3}$) may be partially included. Further, it is preferable that a part or all of the low-impurity-concentration layer is present in the upper layer region having a depth of 100 nm or less at lower side from the upper surface of the n-type cladding layer 21.

According to the experimental results described later, in the obliquely upward growth of the Ga-rich layer 21b, when the donor impurity concentration is low, growth to the lateral direction is promoted, and the above-mentioned inclination angle θ tends to be small. Therefore, when the donor impurity concentration is controlled to be low in the vicinity of the upper surface of the n-type cladding layer 21, the inclination of the Ga-rich layer 21b decreases, and the above-mentioned low inclined portion of the Ga-rich layer 21b is formed. As described above, since the low inclined portion of the Ga-rich layer 21b is formed near the upper surface of the n-type cladding layer 21, the above-described forward current efficiently flows laterally in the n-type cladding layer 21, thereby reducing the parasitic resistance to the forward current flowing laterally.

As described above, when the n-type cladding layer 21 having the base layer 21a and the Ga-rich layer 21b is formed, the active layer 22 (the barrier layer 22a, the well layer 22b), the electron blocking layer 23, the p-type cladding layer 24, the p-type contact layer 25, and the like are subsequently formed on the entire upper surface of the n-type cladding layer 21 by a well-known epitaxial growth method such as an organometallic compound vapor epitaxy (MOVPE) method.

Next, by a well-known etching method such as reactive ion etching, the second region R2 of the nitride semiconductor layers 21 to 25 stacked in the above manner is selectively etched until the upper surface of the n-type cladding layer 21 is exposed. As a result, the second region R2 part of the upper surface of n-type cladding layer 21 is exposed. Then, the p-electrode 26 is formed on the p-type contact layer 25 in the unetched first region R1 and the n-electrode 27 is formed on the n-type cladding layer 21 in the etched second region R2 by a well-known deposition method such as an electron-beam evaporation method. After at least one of the p-electrode 26 and the n-electrode 27 is formed, heat treatment may be performed by a well-known heat treatment method such as RTA (instantaneous thermal annealing).

Note that, as an example, the light-emitting element 1 can be used in a state in which it is flip-chip mounted on a base such as a submount and then sealed by a predetermined resin such as a silicone resin or an amorphous fluororesin (e.g., a resin having a lens shape)

<Examples of Ga-Rich Layers>

Next, a sample for observing the cross section of the n-type cladding layer 21 is produced, a sample piece having a cross section perpendicular (or substantially perpendicular) to the upper surface of the n-type cladding layer 21 is processed by a focused ion beam (FIB), and the sample piece is observed by a scanning transmission electron microscope (STEM), and the result will be described referring to the drawings.

The sample was produced by sequentially depositing the n-type cladding layer 21, the active layer 22 composed of three respective layers of barrier layer 22a and well layer 22b, the n-type cladding layer having a higher AlN molar fraction than the barrier layer 22a, an AlGaN layer for protecting the sample surfaces, and a protective resin film on the underlying part 10 composed of the sapphire substrate 11 and the AlN layer 12 in accordance with the manufacturing procedure of the AlGaN layer 21 and the like described above. In the preparation of the sample, the underlying part 10 in which multi-step terraces as exemplified in FIG. 4D were appeared on the surface of the AlN layer 12 using the sapphire substrate 11 whose main surface has an off-angle with respect to the (0001) plane was used. The interval in the lateral direction of steps at the ends of the terraces is approximately 300 nm to 350 nm. In the preparation of the sample, the film thickness of the n-type cladding layer 21 was set to 2 µm, and the dose of donor impurity (Si) was experimentally controlled so that the donor impurity concentration from the bottom to 1.9 µm was $1\times10^{18}$ to $5\times10^{18}$ cm$^{-3}$, and the donor impurity concentration in the upper layer region between 1.9 µm and 2.0 µm from the bottom was $1\times10^{17}$ cm$^{-3}$ or less.

Figure 5:
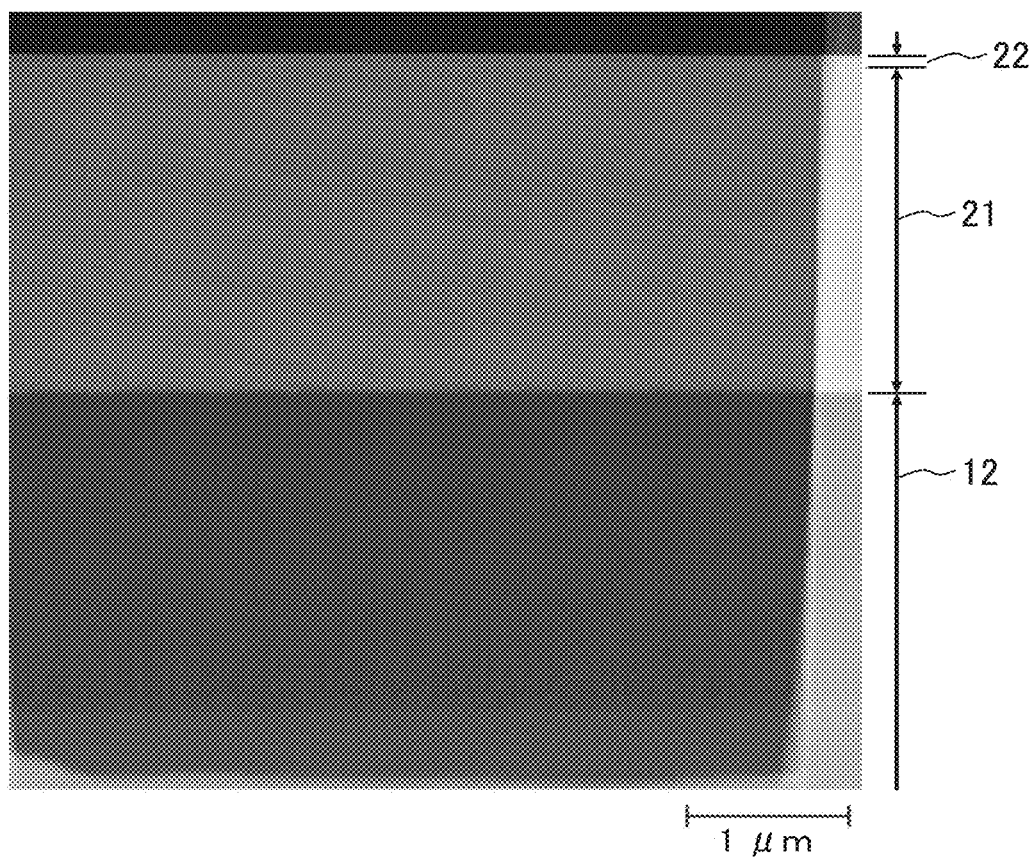
FIG. 5 is a HAADF-STEM image showing a cross-sectional structure in the n-type cladding layer.
Figure 6:
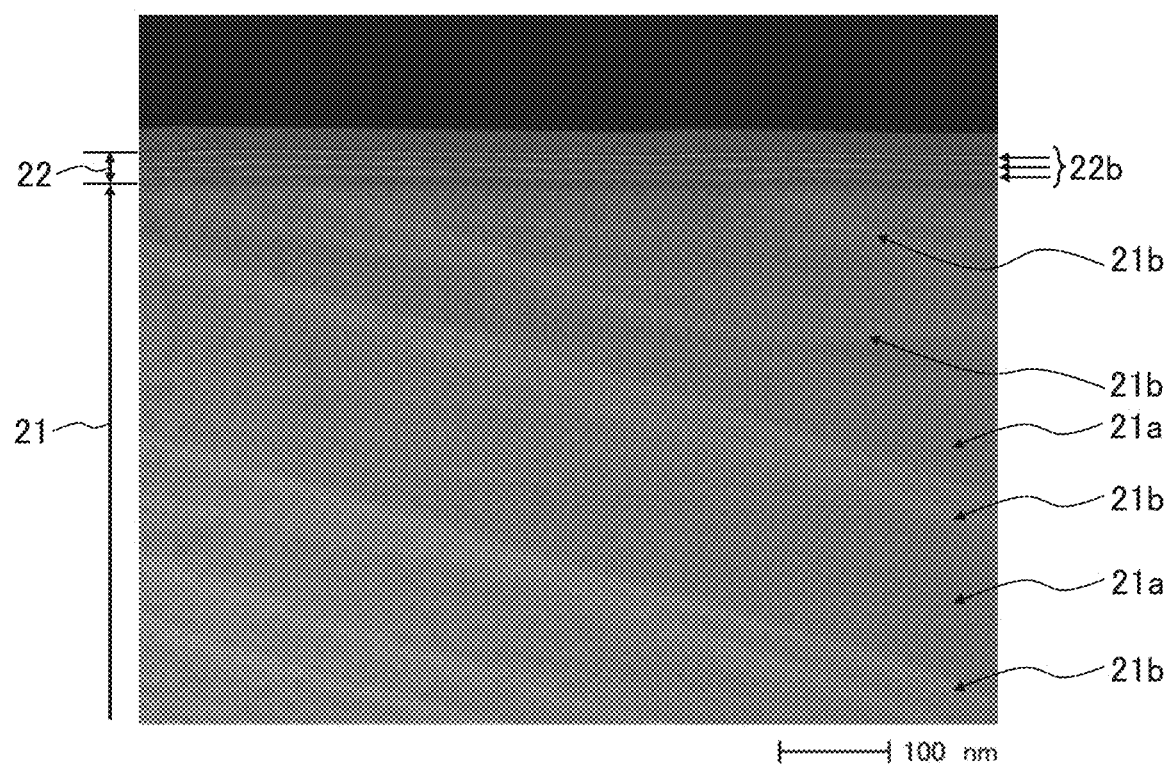
FIG. 6 is an enlarged view of a part of HAADF-STEM image shown in FIG. 5.
Figure 7:
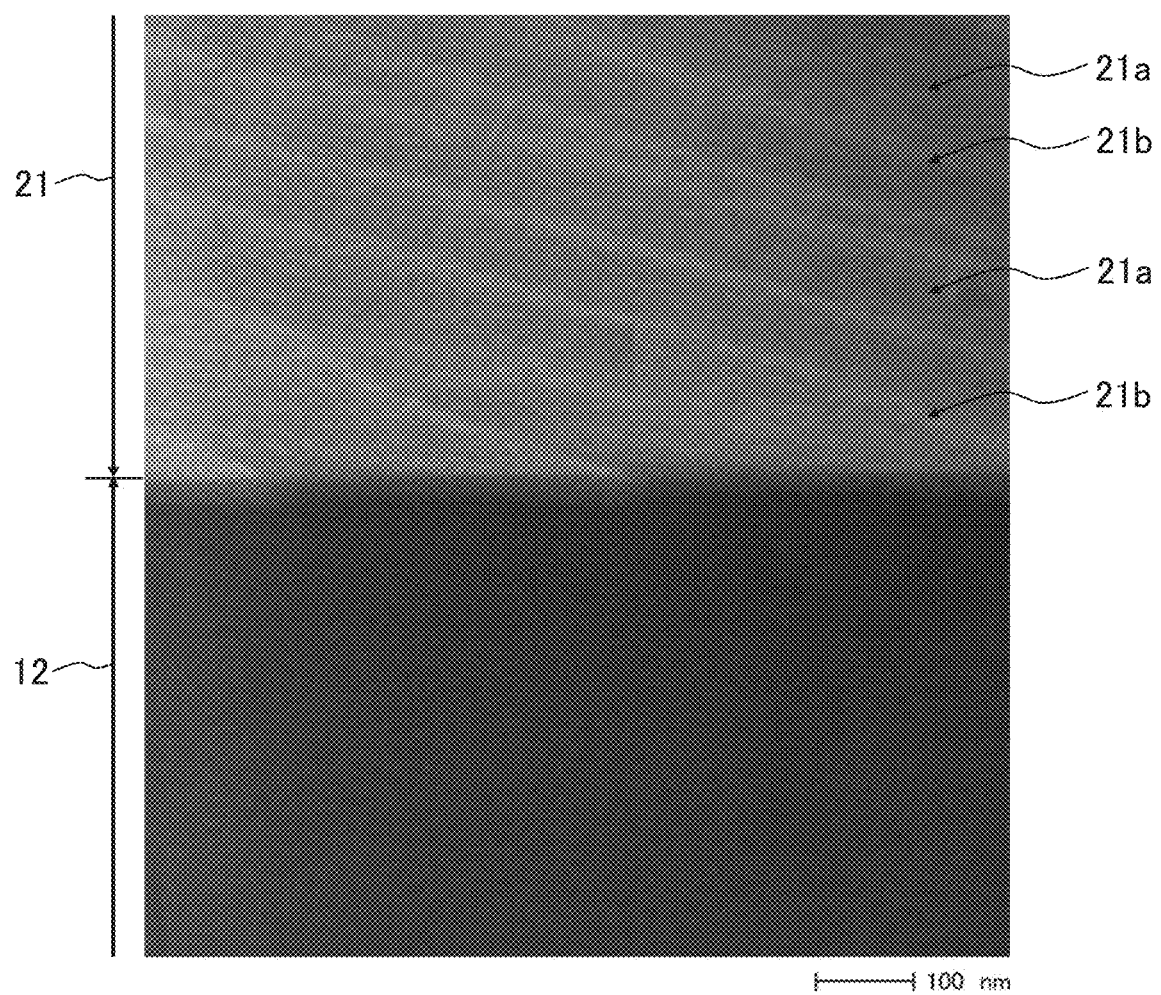
FIG. 7 is an enlarged view of another part of HAADF-STEM image shown in FIG. 5.
Figure 8:
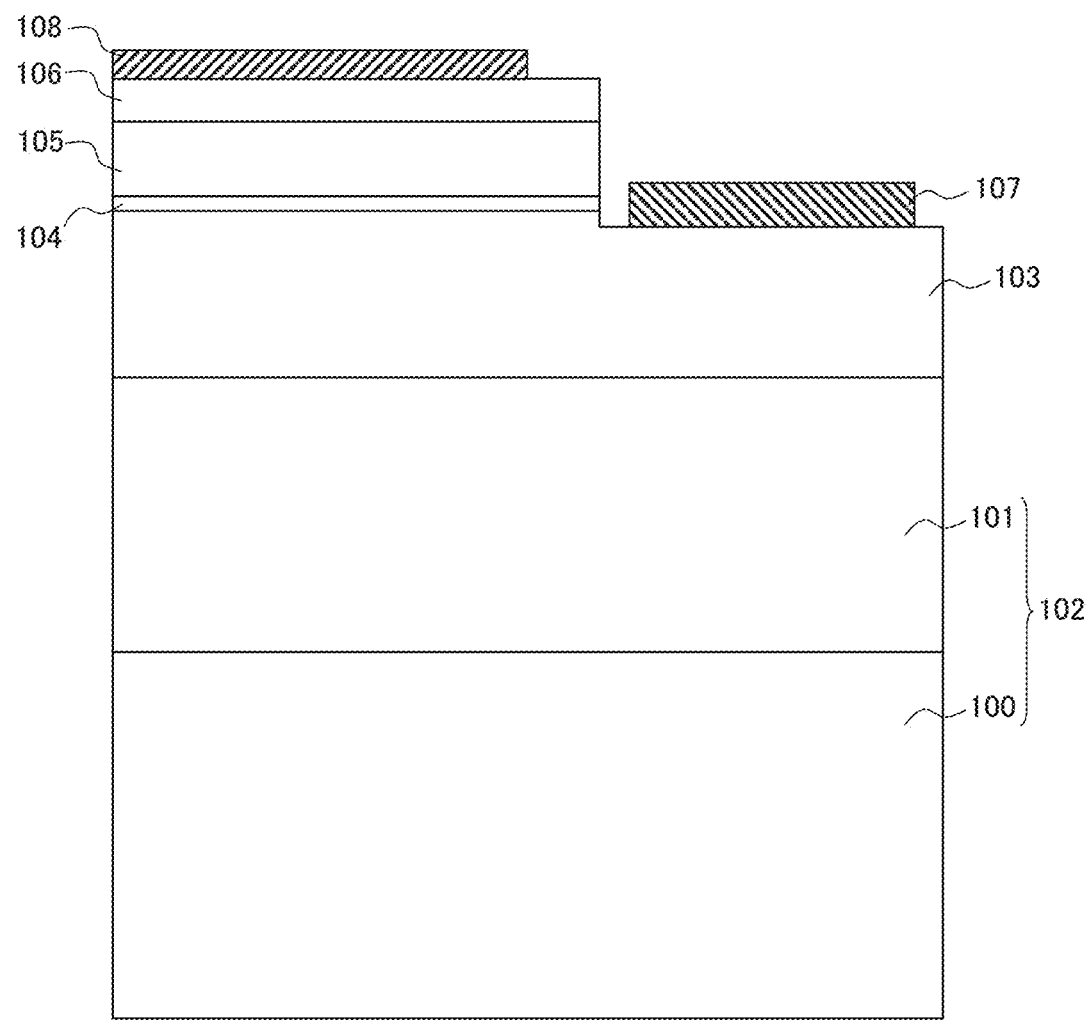
FIG. 8 is a fragmentary cross-sectional view schematically showing an example of an element structure of a typical ultraviolet light-emitting diode.

FIGS. 5 to 7 show the high-angle annular dark-field (HAADF)-STEM image of the cross section of the sample piece. FIG. 5 is a HAADF-STEM image of the entire n-type cladding layer 21 including the upper layer of the AlN layer 12 to the active layer 22 of the sample piece. FIG. 6 is a partially enlarged view of FIG. 5 and is a HAADF-STEM image including a region of about 500 nm from the upper surface of the n-type cladding layer 21 to the lower side and the active layer 22. FIG. 7 is another partially enlarged view of FIG. 5, showing a HAADF-STEM image including an upper layer of the AlN layer 12 and an area of about 500 nm from the lower surface of the n-type cladding layer 21 to the upper side.

In HAADF-STEM image, contrasts proportional to atomic weights are obtained, and heavy elements are displayed brightly. Therefore, as to the base layer 21a and the Ga-rich layer 21b in the n-type cladding layer 21, the Ga-rich layers 21b having lower AlN molar fraction are displayed brighter than the base layers 21a. HAADF-STEM image is more suitable for observing differences in AlN molar fraction than the normal STEM image (bright-field image).

As shown in FIGS. 5 to 7, in the n-type cladding layer 21, there is a plurality of the Ga-rich layers 21b having locally higher Ga-composition ratios and being vertically separated from each other in the base layers 21a. In addition, the extending direction of each Ga-rich layer 21b is generally inclined with respect to the lateral direction, and in the cross-section shown in FIGS. 5 to 7, the inclination angle θ formed between the extending direction and the lateral direction is generally within the range of 0° to 30°, and most of the inclination angle θ is within the range of 10° to 25°. Although each Ga-rich layer 21b extends obliquely upward in a linear manner, it does not necessarily extend in a linear manner, and it can be seen that the inclination angle θ changes depending on the position even within the same Ga-rich layer 21b. It is also observed that, in the cross-sections shown in FIGS. 5 to 7 (corresponding to the first plane), a part of the Ga-rich layers 21b intersects with or diverges from another Ga-rich layer 21b.

Furthermore, in the cross-section shown in FIGS. 5 to 7, the second plane parallel to the upper surface of the n-type cladding layer 21 is supposed to be a straight line parallel to the upper surface of the n-type cladding layer 21, and it can be seen that the base layer 21a and the Ga-rich layer 21b are present together on the straight line. Also, it can be seen that the straight line (the second plane) is present from just above the lower surface to the vicinity of the upper surface in the n-type cladding layer 21 and also present in the upper layer region. Further, it can be seen that there is a plurality of the Ga-rich layers 21b in the range within 1 µm of the straight line, the composition modulation of Ga occurs in the minute areas of 1 µm square or less on the second plane, and the minute areas are dispersed on the second plane.

Comparing the diagrams of FIGS. 5 to 7, it can be seen that in the upper layer region where the donor impurity concentration in the n-type cladding layer 21 is as low as $1\times10^{17}$ cm$^{-3}$ or less, the inclination angle θ of each Ga-rich layer 21b is relatively smaller than the lower side of the upper layer region where the donor impurity concentration is $1\times10^{18}$ cm$^{-3}$ or more, including the inclination angle θ of 10° or less, and locally including 0°. Therefore, it can be seen that in the obliquely upward growth of the Ga-rich layer 21b, when the donor impurity concentration is low, lateral growth is promoted and the above-mentioned inclination angle θ becomes small.

Further, as shown in FIG. 7, the inclination angle θ immediately after the growth start of the Ga-rich layers 21b from the AlN layer 12 is varied by the position of the upper surface of the AlN layer 12, and is in the range of approximately 15° to 25°. Since the possible off angle of the sapphire substrate 11 is at most several degrees, the inclination angle θ of the portion immediately after the growth start of the Ga-rich layers 21b, that is, in contact with the upper surface of the AlN layer 12 (the upper surface of the underlying part 10) is apparently larger than the off angle of the sapphire substrate 11. Further, from FIG. 7, it can be seen that the Ga-rich layers 21b are mainly grown obliquely upward from the vicinity of steps at the end portions of the multi-step terraces formed on the main surface of the AlN layer 12. That is, the main growth start points of the Ga-rich layers 21b are formed in the vicinity of the steps.

Next, for reference, the results of measurement of the AlN molar fraction of each layer of the above-mentioned sample by energy dispersive X-ray analysis (EDX) are shown. The AlN molar fractions of the base layer 21a and the Ga-rich layer 21b measured at about 20 nm from the upper surface of the AlN layer 12 were 71.9% and 59.1%, respectively. The setting value of average AlN molar fraction for the entire n-type cladding layer 21 was 61%. The mean (max, min) AlN molar fraction at each one point of three layers of the barrier layer 22a was 75.1% (75.3%, 74.7%) and the mean (max, min) AlN molar fraction at each one point of three layers of the well layer 22b was 45.5% (47.6%, 42.8%). From these measurement results, it is understood that a difference in AlN molar fraction of 10% or more occurs between the base layer 21a and the Ga-rich layer 21b. Since the AlN molar fraction of the Ga-rich layers 21b is higher than that of each AlN molar fraction of the well layer 22b by 11.5% or more, light emission from the well layer 22b is not absorbed by the Ga-rich layers 21b. The measured values of the AlN molar fractions are merely reference values, and examples of the AlN molar fractions of the plurality of AlGaN-based semiconductor layers constituting the light-emitting element 1.

Other Embodiments

In the above embodiment, as an example of the growth condition of the n-type cladding layer 21, the supply amount and the flow rate of the source gases and the carrier gas used in the organometallic compound vapor phase epitaxy method are set in accordance with the average AlN molar fraction of the entire n-type AlGaN layer constituting the n-type cladding layer 21. That is, when the average AlN molar fraction of the entire n-type cladding layer 21 is set to a constant value vertically, it is assumed that the supply amount and the flow rate of the source gases and the like are controlled to be constant. However, the supply amount and the flow rate of the source gases and the like are not necessarily controlled to be constant.

In the above embodiment, the planarly-viewed shapes of the first region R1 and the p-electrode 26 are exemplarily a comb-like shape, but the planarly-viewed shapes are not limited to the comb-like shape. In addition, a plurality of the first regions R1 may be present, and each of them may be formed in a planarly-viewed shape surrounded by one second region R2.

Figure 4D:
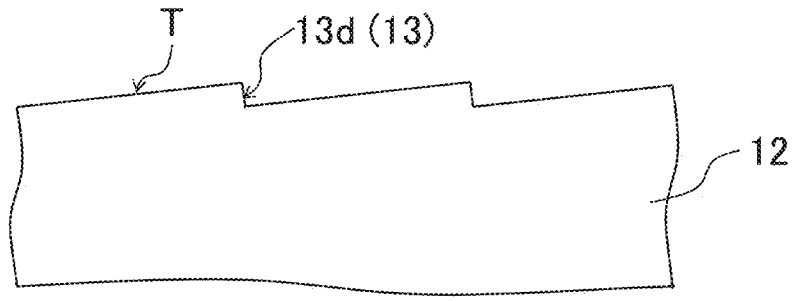

In the above embodiment, the case using the underlying part 10, in which the sapphire substrate 11 in which the main surface has an off-angle with respect to the (0001) surface is used and the multi-step terraces appear on the surface of the AlN layer 12 as illustrated in FIG. 4D, is exemplified. However, the magnitude of the off-angle and the direction in which the off-angle is provided (specifically, the direction in which the (0001) surface is inclined, for example, the m-axis direction, the a-axis direction, and the like) may be arbitrarily determined as long as the multi-step terraces appear on the surface of the AlN layer 12 and the growth start points of the Ga-rich layers 21b are formed.

Further, when the step portions 13 as exemplified in FIGS. 4A to 4C are formed on the surface of the AlN layer 12 by a well-known etching method or the like, it is unnecessary to have the multi-step terraces derived from the main surface 11a of the sapphire substrate 11 appear on the surface of AlN layer 12, so that the off-angle of the sapphire substrate 11 and the growth conditions of the AlN layer can be arbitrarily determined by giving preference to other conditions.

In the above embodiment, the case where the striped or island-like step portions 13 serving as the growth start points of the Ga-rich layer 21b is formed on the upper surface of the underlying part 10 (the surface of the AlN layer 12) has been described, but instead of forming the step portions 13 on the upper surface of the underlying part 10, or in the case where the formation state of the step portion 13 on the upper surface of the underlying part 10 is not enough for the growth of the Ga-rich layers 21b, the step portions serving as the growth start points of the Ga-rich layers 21b may be formed on the upper surface of the n-type cladding layer 21 after the n-type cladding layer 21 is grown to some extent (for example, about 100 nm to 1 µm), and then the growth of the n-type cladding layer 21 may be continued. That is, the step portions serving as the growth start points of the Ga-rich layers 21b may be formed in the intermediate layer of the n-type cladding layer 21.

In the above embodiment, as illustrated in FIG. 1, as the light-emitting element 1, the light-emitting element 1 including the underlying part 10 including the sapphire substrate 11 is illustrated, but the sapphire substrate 11 (further, a part or all of layers included in the underlying part 10) may be removed by lift-off or the like. Furthermore, the substrate constituting the underlying part 10 is not limited to the sapphire substrate.

INDUSTRIAL APPLICABILITY

The present invention is available for a nitride semiconductor ultraviolet light-emitting element having a light-emitting layer composed of an AlGaN-based semiconductor.

DESCRIPTION OF SYMBOLS

1 Nitride semiconductor ultraviolet light-emitting element
10 underlying part
11 sapphire substrate
11a main surface of sapphire substrate
12 AlN layer
13 step portion
13a groove
13b protrusion
13c,13d step
20 light-emitting element structure part
21 n-type cladding layer (n-type layer)
21a base layer (n-type layer)
21b Ga-rich layer (n-type layer)
22 active layer
22a barrier layer
22b well layer
23 electron blocking layer (p-type layer)
24 p-type cladding layer (p-type layer)
25 p-type contact layer (p-type layer)
26 p-electrode
27 n-electrode
100 substrate
101 AlGaN-based semiconductor layer
102 template
103 n-type AlGaN-based semiconductor layer
104 active layer
105 p-type AlGaN-based semiconductor layer
106 p-type contact layer
107 n-electrode 108 p-electrode
BL boundary line between first region and second region
CL skeletal line of a planarly-viewed pattern of first region
OL peripheral line of a planarly-viewed pattern of first region
R1 first region
R2 second region
T terrace on a surface of AlN layer

The invention claimed is:

1. A nitride semiconductor ultraviolet light-emitting element comprising:
a semiconductor laminated portion including an n-type layer composed of an n-type AlGaN-based semiconductor layer, an active layer of an AlGaN-based semiconductor layer formed on a first region on an upper surface of the n-type layer, and a p-type layer composed of at least one p-type AlGaN-based semiconductor layer formed on an upper surface of the active layer;
an n-electrode formed on a second region that is not the first region on the upper surface of the n-type layer; and
a p-electrode formed on an upper surface of the p-type layer,
wherein the active layer has a quantum well structure comprising at least one well layer composed of an AlGaN-based semiconductor layer,
in the n-type layer below at least the first region of the upper surface of the n-type layer, a plurality of thin film Ga-rich layers that is a part of the n-type layer having a locally high Ga composition ratio exists spaced apart from each other in a vertical direction that is orthogonal to the upper surface,
an extending direction of at least a part of the plurality of Ga-rich layers on a first plane parallel to the vertical direction is inclined with respect to an intersection line between the upper surface of the n-type layer and the first plane,
in each of a plurality of second planes parallel to the upper surface of the n-type layer, the plurality of Ga-rich layers is present in stripes, and at least one of the plurality of second planes exists in an upper layer region having a thickness of 100 nm or less at lower side from the upper surface of the n-type layer,
AlN molar fractions of the Ga-rich layers present below the first region are larger than an AlN molar fraction of the well layer.

2. The nitride semiconductor ultraviolet light-emitting element according to claim 1, wherein minute areas of 1 μm square or less in which composition modulation of Ga occurs due to partial presence of the Ga-rich layers in stripes is dispersed on at least one of the second planes in the upper layer region below the first region.

3. The nitride semiconductor ultraviolet light-emitting element according to claim 1, wherein
the plurality of Ga-rich layers has at least portions separated in the vertical direction in the upper layer region, and
a minimum value of vertical separation distance between the vertically adjacent Ga-rich layers is 100 nm or less.

4. The nitride semiconductor ultraviolet light-emitting element according to claim 1, wherein at least a part of the plurality of Ga-rich layers exists in the n-type layer below an area where the n-electrode is formed in the second region of the upper surface of the n-type layer.

5. The nitride semiconductor ultraviolet light-emitting element according to claim 1, wherein at least a part of the plurality of Ga-rich layers has a low inclined portion in which an inclination angle of the extending direction of the Ga-rich layers on the first plane is 0° or more and 10° or less with respect to the intersection line.

6. The nitride semiconductor ultraviolet light-emitting element according to claim 5, wherein the low inclined portion exists in the upper layer region.

7. The nitride semiconductor ultraviolet light-emitting element according to claim 1, wherein the plurality of Ga-rich layers has at least portions intersecting with or diverging from another Ga-rich layer on the first plane.

8. The nitride semiconductor ultraviolet light-emitting element according to claim 1, wherein a low impurity concentration layer having a relatively lower n-type impurity concentration than other regions in the n-type layer exists in the n-type layer as a layer parallel to the second plane.

9. The nitride semiconductor ultraviolet light-emitting element according to claim 8, wherein the low impurity concentration layer is present in the upper layer region.

10. The nitride semiconductor ultraviolet light-emitting element according to claim 1, wherein an inclination angle of the extending direction with respect to the intersection line at any one point of the plurality of Ga-rich layers on the first plane is within a range of 0° or more and less than 45°.

11. The nitride semiconductor ultraviolet light-emitting element according to claim 1, further comprising an underlying part including a sapphire substrate, wherein
the semiconductor laminated portion is formed on the underlying part, and
a plurality of step portions to be growth start points of the Ga-rich layers is dispersedly formed on an upper surface of the underlying part.

* * * * *